US008772016B2

(12) United States Patent
Newby et al.

(10) Patent No.: US 8,772,016 B2
(45) Date of Patent: Jul. 8, 2014

(54) SEALED CHIP PACKAGE

(75) Inventors: Paul Newby, Palo Alto, CA (US);
William R. Hanson, Mountain View, CA (US); John Dixon, Moss Beach, CA (US); Bidhan Chaudhuri, San Jose, CA (US); Ravi Saxena, San Jose, CA (US)

(73) Assignee: Pacific Biosciences of California, Inc., Menlo Park, CA (US)

( * ) Notice: Subject to any disclaimer, the term of this patent is extended or adjusted under 35 U.S.C. 154(b) by 542 days.

(21) Appl. No.: 12/939,900

(22) Filed: Nov. 4, 2010

(65) Prior Publication Data
US 2011/0183409 A1 Jul. 28, 2011

Related U.S. Application Data

(60) Provisional application No. 61/261,212, filed on Nov. 13, 2009.

(51) Int. Cl.
*C12M 1/34* (2006.01)
*B65D 25/04* (2006.01)
*B65B 43/00* (2006.01)
*B65B 5/00* (2006.01)
*B32B 3/24* (2006.01)
*H01L 21/673* (2006.01)

(52) U.S. Cl.
CPC ................ *H01L 21/67356* (2013.01)
USPC .......... 435/287.2; 422/401; 428/138; 53/467; 53/492; 220/555

(58) Field of Classification Search
USPC ................ 426/264; 53/492, 467; 220/555; 435/287.2; 428/138; 422/401
See application file for complete search history.

(56) References Cited

U.S. PATENT DOCUMENTS

| 5,837,832 | A | 11/1998 | Chee et al. |
| 6,727,162 | B2 * | 4/2004 | Holzapfel et al. ............ 438/464 |
| 6,841,663 | B2 | 1/2005 | Lefkowitz et al. |
| 6,917,726 | B2 | 7/2005 | Levene et al. |
| 7,170,050 | B2 | 1/2007 | Turner et al. |
| 7,232,656 | B2 | 6/2007 | Balasubramanian et al. |
| 7,292,742 | B2 | 11/2007 | Levene et al. |
| 7,335,762 | B2 | 2/2008 | Rothberg et al. |
| 2003/0044781 | A1 | 3/2003 | Korlach et al. |
| 2006/0165559 | A1 * | 7/2006 | Greenstein et al. ............ 422/63 |
| 2007/0036511 | A1 | 2/2007 | Lundquist et al. |
| 2007/0134128 | A1 | 6/2007 | Korlach |
| 2008/0123089 | A1 * | 5/2008 | Seul et al. ................. 356/237.5 |

* cited by examiner

Primary Examiner — William H Beisner
Assistant Examiner — Danielle Henkel
(74) Attorney, Agent, or Firm — Robert H. Reamey

(57) ABSTRACT

The invention provides environmental packages, instruments, and methods for sealing, protecting, and providing analysis chips for processing and analysis. The analysis chips are bonded directly or indirectly to chip carriers which are held within the chambers of an environmental packaging strip. The chambers are sealed with a sealing film such that the chip carriers can be extracted using a piercing tool and an extraction tool.

14 Claims, 9 Drawing Sheets

SEALED CHIP PACKAGE

CROSS-REFERENCE TO RELATED APPLICATIONS

This application claims the benefit of Provisional U.S. Patent Application No. 61/261,212, filed Nov. 13, 2009; the full disclosure of which is hereby incorporated by reference in its entireties for all purposes

STATEMENT REGARDING FEDERALLY SPONSORED RESEARCH

Not Applicable.

BACKGROUND OF THE INVENTION

The measurement of large numbers of chemical species at one time in a high throughput manner is important in a number of areas including drug discovery and genomics. Advances in the understanding of molecular biology and genetics and the promise of biotechnology have created a need for improved tools. For example, new information provided by projects such as the Human Genome Project has created even more demand for faster, higher throughput methods for sequencing DNA. The tremendous efforts put into sequencing in the last decade have helped researchers begin to understand fundamental cell function. These efforts have accelerated the pace of research and discoveries and have created a growing need for improved tools for analyzing a large variety of molecules in addition to DNA. The benefits to mankind in medicine, agriculture and for the environment, as well as the economic potential that these fields promise, are driving researchers to decipher the function of individual genes, molecules and the cells that contain them. By sequencing an organisms' DNA and analyzing the molecules that make up its cells, researchers are able to develop an understanding of the systems and structure that make it function.

Optical methods can provide the sensitivity and reliability required for high throughput analysis. In order to optically interrogate samples, one must have a means for introducing a sample into an instrument which is capable of optically engaging the samples. For example, as described by Eid, et al. Science, 323, 133-138, 2009 an array of optical confinements can be used to carry out thousands of sequencing reactions simultaneously using a chip having thousands of optical confinements. One way to introduce such a sample into an optical instrument is to provide a consumable element such as a chip which is precisely manufactured for high throughput optical analysis of a sample introduced onto the chip. Such a consumable should be environmentally protected from the point of manufacture to the point where it is brought into contact with a sample and analyzed in the instrument in order to avoid contamination. There is a need for packaging systems and for methods of providing a high-throughput analysis chip that is sealed for shipping, handling, and storing, yet can be quickly and reliably removed from the sealed environment for the addition of samples and reagents for analysis. These are particularly important for analyses which are carried out by automated, robotic equipment.

BRIEF SUMMARY OF THE INVENTION

In one aspect the invention comprises an environmentally sealed strip having a plurality of chambers, each chamber having a top, a bottom, and side walls, wherein at least one of the top, bottom, or side walls of each chamber is sealed with a sealing film, wherein each chamber has sealed therein a chip carrier, wherein the chip carrier comprises an analysis chip bonded thereto.

In some embodiments the strip is a linear strip having from 2 to 12 chambers. In some embodiments each chip carrier is reversibly held in place within each chamber. In some embodiments each chip carrier is held in place through one or more break-away features that are broken away to extract the chip carrier from the chamber. In some embodiments the chip carrier is molded into a strip housing, and the break-away features comprise molded break-away tabs. In some embodiments each chamber is sealed with a sealing film, and the chip carriers are disposed in the bottom portion of each chamber.

In some embodiments the chip carriers are disposed such that the top of each chip carrier is below the level of the sealing film by a distance that is at least one half of a cross-sectional dimension of the chamber. In some embodiments the chambers have a square or rectangular cross-sectional profile, and the chip carriers are disposed such that the top of each chip carrier is below the level of the sealing film by a distance that is at least one half of the length of a side of the square or rectangular profile. In some embodiments each analysis chip is bonded to the bottom of each chip carrier such that a portion of the chip extends below the chip carrier to provide for physical access to sides of the chip. In some embodiments the analysis chip is part of a chip assembly, and the analysis chip is bonded to the chip carrier via the chip assembly. In some embodiments the top of each chip carrier comprises a collar which is capable of being gripped by an extraction tool.

In some embodiments the strip further comprises a strip capping piece on top of the sealing film, such strip capping piece having an opening corresponding to each chamber. In some embodiments the strip further comprises a base piece attached to the bottom of the strip.

In some embodiments the bottom of the chambers is sealed with a sealing film, and the base piece is attached below the sealing film. In some embodiments the sealing film comprises a foil, a polymer, or a combination thereof. In some embodiments the one or more side walls of the chambers are transparent or have transparent portions. In some embodiments the analysis chip is part of an analysis chip assembly comprising a substantially planar analysis chip bonded to a well-forming piece, whereby a well is formed in the assembly allowing for the addition and containment of liquid reagent in contact with the analysis chip. In some embodiments the analysis chip assembly is bonded to the chip carrier with adhesive. In some embodiments the chip comprises an array of optical confinements. In some embodiments the optical confinements comprise ZMWs.

In one aspect the invention comprises a molded part having a plurality of conduits extending therethrough, each conduit having an open top, and open bottom, and side walls, wherein within each conduit a chip carrier having a top and a base is held in the conduit by break-away tabs, the chip carrier configured to allow for the bonding of an analysis chip assembly to the base of the chip carrier, and the tops and bottoms of the conduits configured to be environmentally sealed.

In one aspect the invention comprises a chip assembly comprising two pieces bonded together, the first piece comprising a square or rectangular fused silica sheet having a cladding layer with a plurality of optical confinements on its top surface; and the second piece comprising a fused silica chip having a hole extending therethrough, whereby the assembly comprises a well into which a liquid can be added to contact the optical confinements wherein the well acts to contain the liquid, and wherein the exposed portion of the chip comprise the bottom of the well.

In some embodiments the plurality of optical confinements comprises more than 10,000 optical confinements. In some embodiments the plurality of optical confinements comprises between than 10,000 and 10 million optical confinements. In some embodiments the optical confinements comprise ZMWs.

In some embodiments the chip comprises a trench which extends around the perimeter of the bottom of the bottom of the well to arrest the flow of adhesive used to bond the first piece and the second piece.

In one aspect the invention comprises a method of providing an analysis chip comprising: (a) providing a strip having a plurality of sealed chambers, each chamber having a bottom, a top, and sidewalls, the top of each chamber sealed with a sealing film; wherein a chip carrier comprising an analysis chip is disposed within each chamber; (b) piercing the sealing layer of at least one of the chambers with a piercing tool; and (c) extracting the chip carrier from the chamber with an extraction tool.

In some embodiments the method further comprises transporting the extracted chip carrier to a holder which holds the chip as reagents are added to the chip. In some embodiments the piercing tool comprises one or more ridges, each ridge configured to make a cut in the sealing film. In some embodiments the tool has four ridges.

In some embodiments the piercing tool extends through the sealing film and pushes down the film to create an opening through which the chip carrier is extracted. In some embodiments the piercing tool has four ridges such that when the piercing tool extends through the film, four cuts are made to produce four flaps which are pushed down into the chamber. In some embodiments the top of each chamber is sealed with a sealing film, and the chip carriers are disposed in the bottom portion of each chamber whereby the extraction tool extends through the top of the chamber.

In some embodiments the chip carriers are disposed such that the top of each chip carrier is below the level of the sealing film by a distance that is at least one half of a cross-sectional dimension of the chamber. In some embodiments the chambers have a square or rectangular cross-sectional profile, and the chip carriers are disposed such that the top of each chip carrier is below the level of the sealing film by a distance that is at least one half of the length of a side of the square or rectangular profile.

In some embodiments the piercing tool and the extraction tool are incorporated into a single piercing/extraction tool. In some embodiments the piercing portion of the piercing tool is inside the single piercing/extraction tool, and wherein the piercing tool extends to pierce the film, and subsequently retracts within the single tool to allow the extraction tool to engage with the chip carrier. In some embodiments the chip carrier is attached to the strip; and the extraction tool grips the chip carrier and displaces the chip carrier to detach the chip carrier from the strip.

In some embodiments the chip carrier is attached to the chip through break-away tabs. In some embodiments the break-away tabs are molded tabs. In some embodiments the chip carrier is displaced down by the extraction tool to detach the chip carrier. In some embodiments the strip is a linear strip having from 2 to 12 chambers. In some embodiments the sealing film comprises a foil, a polymer, or a combination thereof.

In some embodiments the method is carried out on an automated robot.

In some embodiments the analysis chip is part of a chip assembly which is bonded to the to the chip carrier. In some embodiments wherein the chip carrier has a top and a base and the chip assembly is bonded to the base of the chip carrier whereby the analysis chip extends below the chip carrier. In some embodiments, after the chip carrier is extracted, it is placed in a processing station where reagents are added, and is subsequently moved to an analysis station wherein an edges of the analysis chip is used to orient the analysis chip in the analysis station.

In one aspect the invention comprises a method for producing a sealed chip carrying strip comprising; providing a molded part having a plurality of conduits extending therethrough, each conduit having an open top, and open bottom, and side walls, wherein within each conduit is a chip carrier having a top and a base that is held in the conduit by breakaway tabs; attaching a chip assembly comprising an analysis chip to the base of the chip carrier; sealing the open bottom and the open top to environmentally seal the analysis chips within the conduits; wherein at least one of the open top and open bottom is sealed with a sealing film.

In some embodiments the open top is sealed with a sealing film further comprising attaching a strip capping piece, wherein the strip capping piece comprises openings corresponding to teach of the conduits. In some embodiments both the open top and open bottom are sealed with a sealing film, further comprising attaching a bottom piece which protects the sealing film on the open bottoms during handling.

In one aspect the invention comprises an analysis instrument comprising: (a) a station for receiving a sealed environmental strip having a plurality of sealed chambers, each chamber having a bottom, a top, and sidewalls, the, top of each chamber sealed with a sealing film; wherein a chip carrier comprising an analysis chip is disposed within each chamber; (b) an automated chip extractor comprising (i) a piercing tool that pierces the sealing layer of at least one of the chambers; and (ii) an extraction tool that extracts the chip carrier from the chamber and transports the analysis chip to an automated processing station; (c) an automated processing station that prepares the chips for analysis by adding at least one reagent, and at least one sample to the chip; (d) a tool for transporting the analysis chip from the processing station to an analysis station; and (e) an analysis station which holds the chip in place during analysis.

In some embodiments the analysis comprises nucleic acid sequencing.

In some embodiments the piercing tool comprises one or more ridges, each ridge configured to make a cut in the sealing film. In some embodiments the tool has four ridges.

In some embodiments the piercing tool extends through the sealing film and pushes down the film to create an opening through which the chip carrier is extracted. In some embodiments the piercing tool has four ridges such that when the piercing tool extends through the film, four cuts are made to produce four flaps which are pushed down into the chamber. In some embodiments the top of each chamber is sealed with a sealing film, and the chip carriers are disposed in the bottom portion of each chamber whereby the extraction tool extends through the top of the chamber.

In some embodiments n the piercing tool and the extraction tool are incorporated into a single piercing/extraction tool. In some embodiments the piercing portion of the piercing tool is inside the single piercing/extraction tool, and wherein the piercing tool extends to pierce the film, and subsequently retracts within the single tool to allow the extraction tool to engage with the chip carrier. In some embodiments the chip carrier is attached to the strip; and the extraction tool grips the chip carrier and displaces the chip carrier to detach the chip carrier from the strip. In some embodiments the chip carrier is attached to the chip through break-away tabs. In some embodiments the break-away tabs are molded tabs. In some embodiments the chip carrier is displaced down by the extraction tool to detach the chip carrier. In some embodiments the strip is a linear strip having from 2 to 12 chambers. In some embodiments the sealing film comprises a foil, a polymer, or a combination thereof. In some embodiments the analysis chip is bonded to the chip carrier whereby the analysis chip extends below the chip carrier. In some embodiments the analysis chip is placed in the analysis station, one or more edges of the chip are used to physically position the analysis chip.

DETAILED DESCRIPTION OF THE INVENTION

I. General

Figure 1:
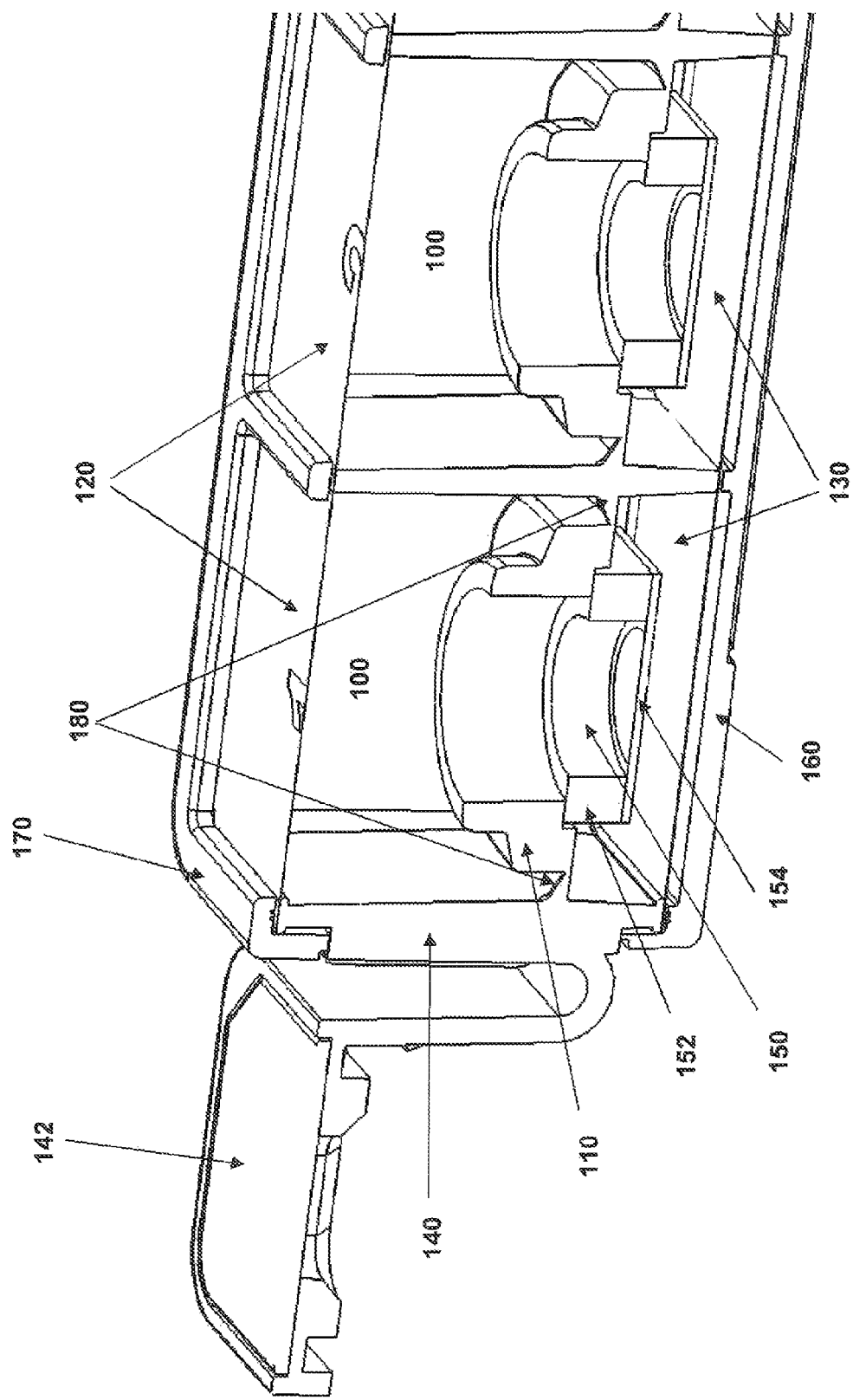
FIG. 1 is a cross-sectional drawing illustrating an environmentally sealed strip package of the invention.

The invention provides for the packaging, shipping, handling, and storage of analysis chips, particularly analysis chips for use in high-throughput optical systems. The invention provides environmental packages having a plurality of chambers, each containing an analysis chip that is sealed from the environment. The environmental packages of the invention protect the chips from environmental contamination, and also protect the chips from damage on handling and shipping. In addition, the packages of the invention provide for the facile removal of the analysis chip, in particular with automated tools which can be driven by a robotic system. The environmental packages allow for each analysis chip to be individually sealed, such that the extraction of one analysis chip does not expose the other chips in the package to the environment.

The packages of the invention are provided as strips having multiple chambers. Each chamber is separately environmentally sealed such that one chip can be removed from its chamber without compromising the chips in the other chambers. In some cases the strip is a linear strip having, for example, 4, 6, 8, 9, or 12 chambers, each individually sealed. In some cases, the strip has the chambers arranged in a radial arrangement. A radial arrangement, for example with chambers arranged on a circle in a strip also having a central portion, can be useful for introducing the chambers into a robotic handling system. The radial arrangement allows for turning of the strip to move a chamber into position for interaction with the robotic system. The analysis chips are generally attached, directly or indirectly, to a chip carrier. The chip carrier generally has a structure which can immobilize the chip within the chamber. The chip carrier has a structure which can engage with an extraction tool, the structure, for example, providing surfaces which the extraction tool can grip firmly, allowing for the extraction of the chip from the strip. The chip carrier can also facilitate transporting the chip from the packaging strip to other stations wherein subsequent manipulations including the addition of reagents and sample, and the placement of the chip comprising the sample into an analysis portion of an instrument.

The chambers are sealed in such a manner that the chambers can effectively be opened to facilitate extraction of the chip carrier holding the analysis chip. For example, one or more faces of the chamber is sealed with a sheet or film which can be punctured by a piercing tool to open the chamber. In one embodiment, only the top of each of the chambers is sealed with a sheet or film. The sheet or film is selected to have the physical strength and integrity to environmentally protect the chip, while also being susceptible to rupture by a piercing tool.

The chip carrier which holds the analysis chip is generally secured within the chamber to prevent excessive movement within the chamber during handling. The chip carrier can be physically attached within the chamber. In one preferred embodiment, the chip carrier is molded into a portion of the strip, e.g. the strip housing, and is held in place by molded tabs. The tabs are dimensioned to be strong enough to hold the chip carrier firmly in place during shipping and handling, but to be weak enough that they can be broken away to release the chip carrier for extraction. Thus the molded tabs are break-away tabs that can be broken away by the displacement of the chip carrier relative to the strip housing by the extraction tool.

The analysis chip may be bonded directly to the chip carrier, or the chip may be bonded through another element. The chip can be provided, for example, as a chip assembly, wherein the chip assembly is bonded to the chip carrier. The chip assembly can comprise, for example a square or rectangular chip comprising an array of optical confinement structures. Bonded to the top of this chip is a well-forming piece having substantially the same square or rectangular planar dimensions as the chip, and having one or more holes through its center. When the well-forming piece is bonded to the top of the chip, one or more wells are formed in which the base of the well comprises the top of the chip, and the walls of the well comprise the inside walls of the hole through the well-forming piece. The well in the chip assembly provides containment for fluids such as reagents and samples while they are in contact with the chip. The thickness of the well-forming piece is selected such that the volume of the well is sufficient to hold the reagents and samples within the well. The well-forming piece can also provide structural integrity for the chip. The chip can comprise an array of zero mode waveguides (ZMWs) formed on a fused silica chip, and the well-forming piece can comprise a thicker fused silica chip to provide a reagent well and provide structural rigidity.

One aspect of the invention is a method that allows for environmentally protecting an analysis chip, then extracting the chip from its packaging for addition of reagents and samples, and for subsequent analysis. The method involves providing a packaging strip having a plurality of environmentally protected chips attached to chip carriers within the chambers of the strips. Each individual chamber has at least one region sealed with a sealing film. A piercing tool is used to pierce or puncture the sealing film, and an extraction tool is used to detach the chip carrier and extract it from the chamber. The extraction tool can then be used to transport the chip carrier to another station for further processing. In addition to piercing the sealing film, we have found that it is useful for the piercing tool to have ridges for the controlled cutting of the sealing film, and to be dimensioned such that as the tool extends into the chamber, it pushes the sealing film away providing an opening in the sealing film through which the chip carrier can be extracted without contacting the sealing film. For instance, the piercing tool can have a point in the center, and four ridges extending out from the center. The ridges act as cutting blades, cutting the sealing film to create four flaps which can be displaced by another portion of the tool as it extends into the chamber.

Once the piercing tool has opened the chamber, the extraction tool engages the chip carrier, for example by gripping the chip carrier. In one embodiment the chip carrier has a collar, and the extraction tool closes on the outside of the collar or expands from the inside of the collar to grip the chip carrier. Once the extraction tool has engaged the chip carrier, the extraction tool can be used to detach the chip carrier from the chamber. Where the chip carrier is held in place by break-away tabs such as molded break-away tabs, the extraction tool can displace the chip carrier relative to the strip housing to break the tabs and free the chip carrier. The detached chip, carrier can then be extracted from the chamber.

In a preferred embodiment, the piercing tool and extraction tool are each part of a single piercing/extraction tool. Having a single tool for both functions can increase the efficiency of processing as the same tool that extends into the chamber to pierce the film can also engage with the chip carrier and extract it from the chamber without the need to remove one tool and insert another one. In one embodiment, the piercing tool can extend from the single tool to pierce and cut the sealing film, then be retracted up into the tool to allow the extraction tool portion of the tool to engage the chip carrier.

The packages and methods of the invention are particularly suitable for implementation with automated robotic systems which can be used to precisely hold the packing chip, to direct the piercing and extraction tools, to transport the chip to chip processing stations for the addition of reagents and samples, and to transport the chip to the analysis portion of the instrument. The extraction, transport, processing, and analysis can be carried out within a single instrument.

The environmental packages and methods of the invention can be used for a variety of types of analyses. A particularly valuable application is single molecule sequencing. By way of example, a complex of a template nucleic acid, a primer sequence and a polymerase enzyme may be monitored, on a single molecule basis, to observe incorporation of each additional nucleotide during template dependent synthesis of the nascent strand. By identifying each added base, one can identify the complementary base in the template, and thus read off the sequence information for that template. In the context of ZMWs, an individual polymerase/template/primer complex may be provided within the observation volume of the ZMW. As each of four labeled (e.g., fluorescent) nucleotides or nucleotide analogs is incorporated into the synthesizing strand, the prolonged presence of the label on such nucleotide or nucleotide analogs will be observable by an associated optical detection system. Such sequencing processes and detection systems are described in, e.g., Published U.S. Patent Application No. 2003/0044781 and Published U.S. Patent Application No. 2007/0036511, the full disclosures of which are incorporated herein by reference in their entirety for all purposes.

The invention also provides for methods of producing a sealed chip-carrying strip utilizing a molded strip housing having a plurality of conduits having open tops and open bottoms, and having molded within in each conduit a chip carrier. The chip carriers are held within the conduits of the strip housing such that they are accessible from both the top and the bottom. The chip carriers are generally held in place using molded break-away tabs to facilitate subsequent extraction of the chip carriers. To the bottom of each of the chip carriers is bonded a chip assembly. The top and bottom openings of the strip housing are then sealed to environmentally enclose the chip. The sealing is done such that either the top or the bottom or both the top and the bottom are sealed with a sealing film. Generally the top opening is sealed with a sealing film, allowing for the extraction of the chip carrier by engaging with the top portion of the chip carrier.

Environmental Packaging Strip

The present invention provides an environmental packaging strip that environmentally seals a plurality of analysis chips, each in its own environmentally sealed chamber, each chamber partly sealed with a sealing film.

FIG. 1 shows a cross-section of an embodiment of the packaging strip of the invention. The strip has multiple chambers 100. The chambers in the figure are arranged linearly. Chambers in other embodiments can be arranged in other configurations. Two chambers 100 are shown. An analysis chip 154 is held within a chamber 100. The analysis chip 154 is part of chip assembly 150 also comprising well-forming piece 152. The chip assembly 150 is bonded to chip carrier 110. The chip assembly 150 can be bonded to the chip carrier 110, for example, using an adhesive such as a UV curable adhesive. Chip carrier 110 is held within the cavity with molded break-away tabs 180. The walls of the chambers are formed by molded strip housing 140. The strip housing 140 and chip carriers 110 can be produced as a single molded part. The strip has tab 142 for manual handling of the strip. The top of the chambers are sealed with sealing film 120. On top of the chambers is the optional strip capping piece 170. Strip capping piece 170 provides some physical protection for the sealing film and finishes off the top edges of the packaging strip. The strip capping piece 170 can be a molded part which snaps onto the top of the strip. The bottom of the chamber in this embodiment is also sealed with a sealing film 130. Base piece 160 is attached to the bottom of the strip. Base piece 160 can also be molded. Base piece 160 generally does not have openings corresponding to the chambers. It provides physical protection to the bottom strip and provides a base for placing the strip down, and for placing the strips into holders and storage trays. In the embodiment illustrated in FIG. 1, there is a sealing strip on both the top and the bottom of each of the chambers. In other embodiments, only one opening is sealed with a film. For example, the top is sealed with a film, and the bottom is sealed with a base piece which is attached in a manner that provides environmental sealing.

Figure 2:
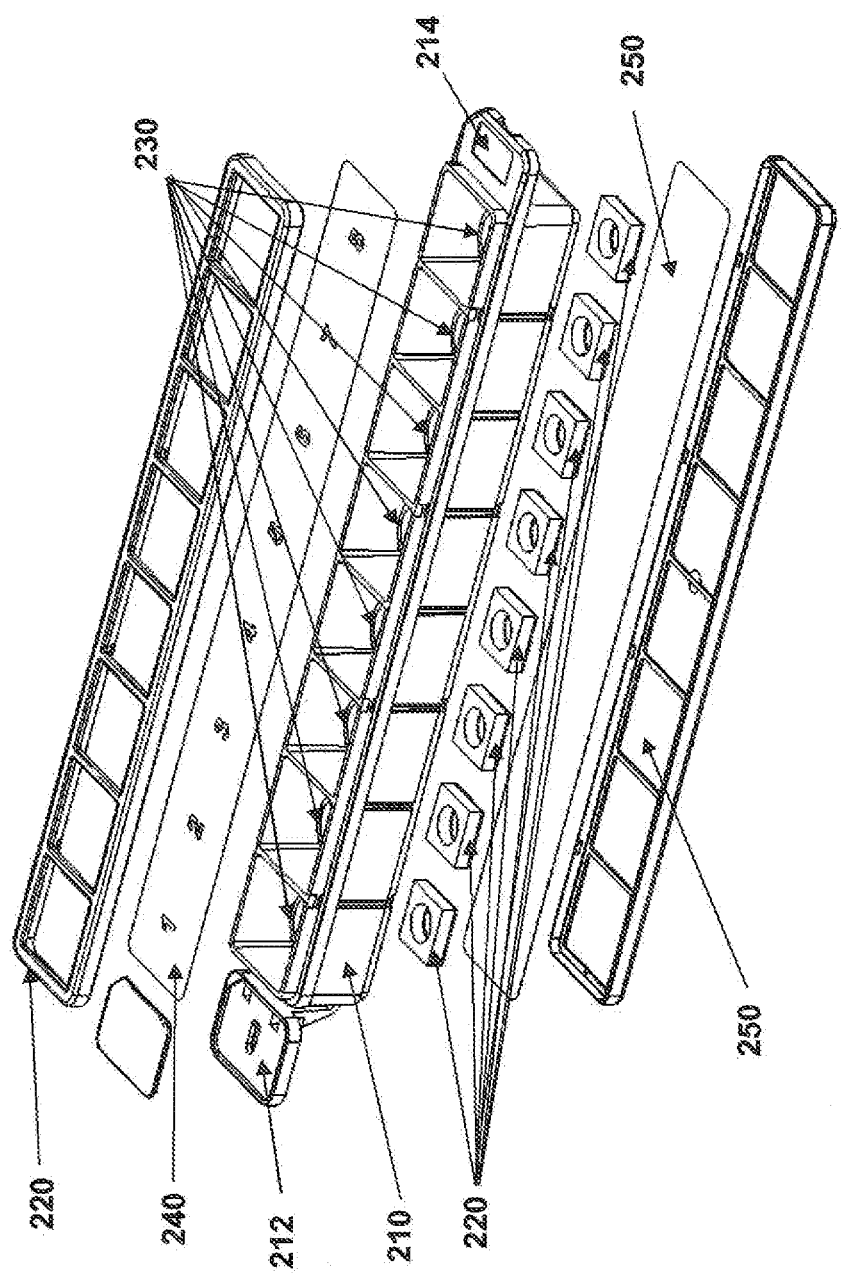
FIG. 2 shows an exploded view of parts to be assembled to produce an environmentally sealed strip.

FIG. 2 shows an exploded view illustrating the parts used for producing a strip having 8 chips, each sealed within its own chamber. Strip housing 210 is a molded part having 8 conduits which when sealed become the chambers. Molded into the strip housing 210 are 8 chip carriers 230. The chip carriers 230 are molded into the conduits such that they are accessible from both the top and the bottom. Strip housing 210 has tabs 212 and 214 for manual handling of the strip. The chip carriers are formed with a base that is configured for bonding to chip assemblies. Chip assemblies 220, each comprise analysis chips bonded to well-forming pieces to produce wells on the top of each chip assembly, are attached to the bases of the chip carriers within the conduits. The tops of the conduits are sealed using sealing film 240, which can, for example, be heat sealed onto the strip housing 210. Strip capping piece 220 can be attached to the top of the strip. Strip capping piece 220 has openings corresponding to the conduits to allow for the extraction of the chip carriers from the chambers. Bottom sealing film 250 is used to seal the bottoms of the conduits. Base piece 260, which is generally a solid piece, is attached to the bottom of the strip to protect the bottom sealing film and provide a base for the strip. As shown here, strip capping piece 220 and base piece 260 are molded parts that can be snapped on to attach to the strip housing.

Figure 3:
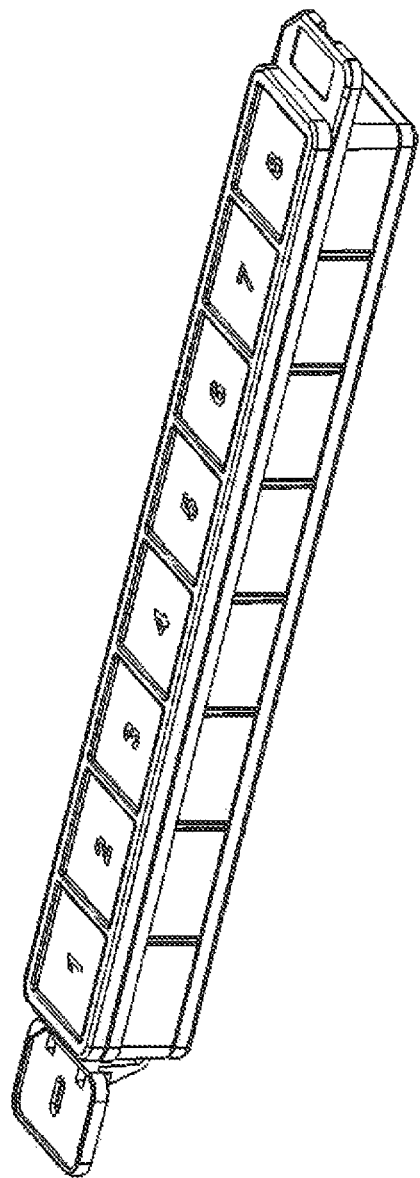
FIG. 3 shows an assembled environmentally sealed strip.

FIG. 3 shows a finished strip assembled from the parts shown in FIG. 2. The strip has 8 chambers, each comprising one chip carrier having one chip assembly bound to it. Once assembled, the strip provides environmental protection for the chips until the chips are extracted for further processing and analysis.

Figure 4:
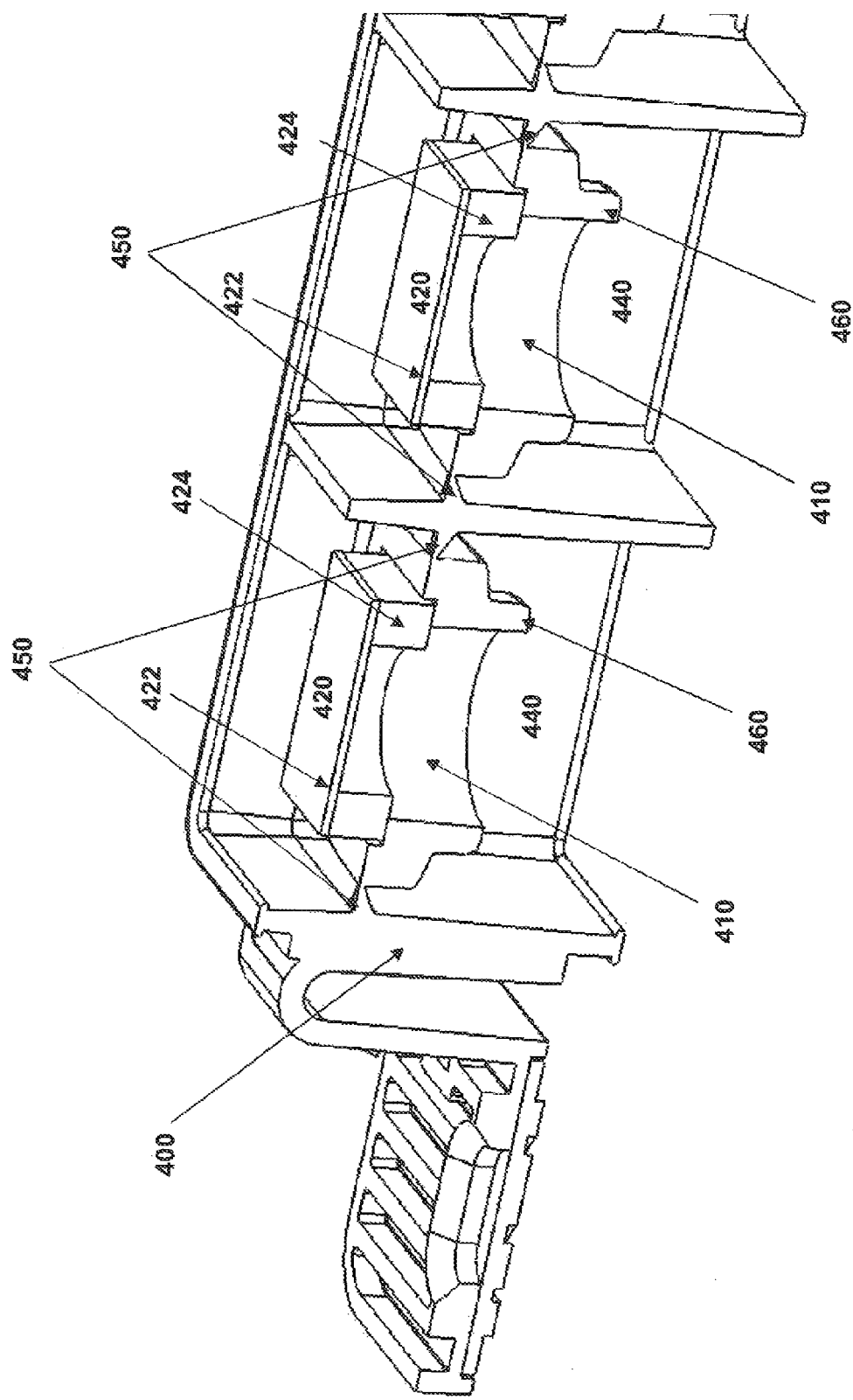
FIG. 4 is a cross-sectional drawing of a molded strip-housing.

FIG. 4 shows a cross sectional view of a molded strip housing 400 having a chip carrier 410 in each conduit, and having bonded to each chip carrier a chip assembly 420. The view in FIG. 4 is looking down at the bottom of the molded strip housing 400. The molded strip housing 400 has multiple conduits 440, each with a top opening (below in the figure) and a bottom opening. In each conduit, a chip carrier 410 is molded, being held in place with tabs 450 which will hold the chip carrier in place during shipping and handling, then can be broken away to detach and extract the chip carrier in order to perform an analysis. The chip carriers 410 are configured to each have a base to which a chip assembly 420 can be bonded. The chip carrier 410 has an opening surrounded by a collar 460. The opening allows for the addition of reagents and samples to the chip 422 while the chip 422 is bonded to the chip carrier 410. Chip assembly 420 is made up of chip 422 bonded to well-forming piece 424. The top and bottom openings of the conduits are configured so that they can be sealed to produce chambers which provide environmental protection for the chips 422, for example with a sealing film.

The environmentally sealed strip has a plurality of chambers. The number of chambers can be chosen depending on the use or on the throughput of samples to be analyzed. The number of chambers can be 2, 3, 4, 5, 6, 7, 8, 9, 10, 12, 13, 14, 15, 16 or more. The number of chambers can be between about 2 and about 1000, between about 4 and about 100, or between about 6 and about 24. The chambers are generally arranged side by side in one layer. In some embodiments the chambers are arranged in one dimension, such as linearly. In some embodiments, the chambers are arranged in two dimensions, for example in rows and columns. In some cases the chambers are arranged in a radial arrangement, for example, one or more concentric circles, or a radial arrangement. The sealed strip can be dimensioned and have features for both for manual handling by operators, and by automated robotic systems.

The chambers provide environmental protection for the chips. Environmental protection includes protection from exposure to gasses, liquids, and solids while the chips are stored, transported, and handled. The level of protection from gasses can be controlled by controlling the materials and dimensions of the walls, top and bottom of the chamber. By choice of materials having the appropriate transport properties, the chips can be protected, for example, from gaseous species such as oxygen, moisture, ozone, ammonia, acids or other volatile compounds. The sealing will also protect the chips from atmospheric liquid and solid contaminants such as dust and vapor, which can carry components that could be harmful to the chip, or could interfere with the analysis. The sealing can also protect the chips from extraneous biological material including nucleic acids, proteins, and other cellular materials. The chambers can also be used to protect the chips from electromagnetic radiation such as visible and ultraviolet light. In some cases, it is desirable that portions of the chambers be transparent in order to provide visual observation within the chamber. If desired, the chambers can be made with material having ultraviolet absorbing components to protect the chips from ultraviolet light while allowing visualization.

The sealing film is chosen to provide the level of protection desired while also allowing for penetration and removal of the chip carriers. Films containing metal foil can be useful, for example for their low vapor transport properties. Such films can also have good mechanical properties, and can be pierced and cut in a reliable manner by the piercing tools described herein. In some cases multilayer films having polymer and metal layers are used.

The chip carrier of the invention provides a structure for handling the analysis chip. The analysis chip can be thin, fragile, and difficult to handle. The chip carrier provides a structure which can engage with the tools for extracting the chip from the chamber and for manipulating and transporting the chip to and from various processing stations. The chip carrier can have specific structures such as ridges, holes, pins, handles, and tabs designed to interact with manipulation tools. The chip carrier is bonded to the analysis chip either directly or indirectly through another element. The chip carrier is generally bound to the chip such that a portion of the chip is exposed for the addition of reagents and samples. In some cases, the chip carrier comprises one or more openings into which reagents and samples can be introduced. The chip carrier can have one central opening for the addition of reagents and samples. In some cases, the chip is bound to the bottom of the chip carrier, where the chip carrier has an opening at the top surrounded by a collar. The collar can provide a feature for engagement with manipulating tools.

The chip carrier is generally constructed such that it can be reversibly held within the chamber so that it will remain in place during shipping and handling, but can be removed for processing and analysis. The chip carrier can be held in place with features that constrain the movement of the chip carrier within the chamber. The chip carrier can be held within the chamber using adhesives such as pressure sensitive, hot melt, or curable adhesives. For example, a pressure sensitive adhesive can be used which holds the chip carrier with enough force to keep it in place during shipping and handling, but forms a bond that can be broken by a tool holding the chip carrier. In some cases, it is preferred that the chip carrier be held in place with break-away features such as break-away molded tabs. The chip carrier can be formed in a mold which also produces the strip housing, such that one molded chip carrier is molded into place within each chamber. By designing the molded tabs with the appropriate geometry, the chip carrier is held in place during shipping and handling, and can be detached by being displaced by an extraction tool. The number of tabs used to hold the chip carrier in place can be chosen for the right balance of retention and break-away properties as well as for ease of manufacturing, The number of tabs can be 1, 2, 3, 4, 5, 6, 7, 8 or more.

In some embodiments, the analysis chip is bonded to the bottom or base of the chip carrier, the chip carrier is held in the bottom portion of the chamber, and the chip carrier is extracted through the top of the chamber. In some cases, the chip carrier is held within the chamber such that it is below the level at which it would be contacted by the sealing film as it is punctured and displaced by the piercing tool prior to extraction. For example, the chip carrier is held such that the top of the chip carrier is below the sealing film at a distance that is one half of a cross-sectional dimension of the chamber. Where the chamber has a square cross-sectional profile, the top of the chip carrier is disposed lower than one half of the distance of the length of the side of the square. Where the chamber has a rectangular cross-sectional profile, the top of the chip carrier is disposed lower than one half of the distance of the length of a side of the rectangle.

In some embodiments the chip carrier is made to have a base which is dimensioned for the attachment of the analysis chip to the base, for example using an adhesive. In some embodiments, the chip is attached to the base of the chip carrier such that the bottom of the chip extends below the chip carrier. This allows the bottom and sides of the chip to be engaged to position the chip. It can be difficult to precisely align the chip using the chip carrier as a physical guide where very high precision is required. Aligning the chip by physical contact to the analysis chip itself can be useful where the chip has features, such as optical features, which must be precisely aligned. For example, the attachment of the extraction tool to the chip carrier, and physical alignment to a processing station by the chip carrier can provide sufficient alignment accuracy for operations such as the addition or removal of reagents and samples, and physical contact with the chip itself can be used to for the more demanding alignment of the chip, for example in an analysis station.

The chip can be any type of analysis chip. The chip can comprise a biopolymer array such as a hybridization chip for binding specific nucleic acids such as those described in U.S. Pat. Nos. 5,837,832 and 6,841,663. Suitable chips include chips for the observation of single molecules such as described in U.S. Pat. No. 7,292,742. The chips can be used for nucleic acid sequencing, for example as descried in U.S. Pat. Nos. 7,335,762 and 7,232,656.

The analysis chip can be constructed, in some cases, such that sample is added to the top of the chip and the samples are optically interrogated from below the chip. Such a chip can be a chip having an array of optical confinements such as zero-mode waveguides (ZMWs), in which the bottom of the chip comprises a transparent material such as a glass or fused silica which has on its top surface a cladding layer with an array of optical confinement structures such as apertures through the cladding layer to the transparent substrate.

In preferred aspects, a molecule to be analyzed, such as a template/polymerase primer complex is provided, typically immobilized, within an optically confined region, such as a zero mode waveguide (ZMW), or proximal to the surface of a transparent substrate, optical waveguide, or the like (see e.g., U.S. Pat. Nos. 6,917,726, and 7,170,050 and Published U.S. Patent Application No. 2007-0134128, the full disclosures of which are hereby incorporated herein by reference in their entirety for all purposes). The optically confined region is illuminated with an appropriate excitation radiation for the fluorescently labeled nucleotides that are to be used. Because the complex is within an optically confined region, or very small illumination volume, only the reaction volume immediately surrounding the complex is subjected to the excitation radiation. Accordingly, those fluorescently labeled nucleotides that are interacting with the complex, e.g., during an incorporation event, are present within the illumination volume for a sufficient time to identify them as having been incorporated.

ZMW arrays can be fabricated at ultra high density, providing anywhere from 1000 ZMWs per $cm^2$, to 1,000,000 ZMWs per $cm^2$, or more. Thus, at any given time, it may be desirable to analyze the reactions occurring in from 100, 1000, 3000, 5000, 10,000, 20,000, 50,000, 100,000 or 1 Million, 10 Million or more ZMWs or other reaction regions within a single analytical system or even on a single substrate.

The analysis chip can be bonded to the chip carrier by any suitable method. The analysis chip can be bonded to the chip carrier using an adhesive such as a pressure sensitive adhesive, a hot melt adhesive, or a curable adhesive such as a UV or visible light curable adhesive.

The environmentally sealed strip can include a strip housing. The strip housing is a part comprising a plurality of conduits which, when sealed will become the environmentally sealed chambers. The strip housing can be made by molding. The conduits have top openings and bottom openings that are configured to be sealed to form chambers. Either the top or bottom opening or both the bottom and top openings are sealed with a sealing film. In some embodiments the top opening is sealed with a sealing film, and the bottom opening is sealed with a bottom piece that is more rigid than the sealing film. In a preferred embodiment the chip carriers are molded into the conduits when the strip housing is molded, and are held in place by molded tabs which can be broken to extract the chip carriers. The strip housing can be made of any suitable material including molding plastics such as polycarbonates, polyesters, polyacrylates, or polyolefins. In some cases, the strip housing is molded out of a transparent material such as polycarbonate.

Chip Assembly

In one aspect, the invention provides a chip assembly or stacked chip comprising a chip having an array of optical confinements and a well-forming piece. The chip comprises a transparent substrate of fused silica having on its top surface a layer of a cladding material. The cladding material can comprise a metal such as aluminum. The chip has an array of optical confinements, for example an array of nanoscale apertures through the cladding layer. The chip is generally rectangular or square. The dimensions of the chip can be from about 0.5 mm to about 100 mm, or from 5 mm to about 20 mm. The chip can be, for example, a square chip about 9 mm on a side.

The well-forming piece comprises a fused silica chip having one or more openings such that when the well-forming piece is bonded to the analysis chip one or more wells is formed in which the chip comprises the bases of the wells, and the walls of the openings on the well-forming piece comprise the sides of the wells. In some cases, the well-forming piece comprises one opening, and the opening is in about the center of the chip. The well-forming piece is generally thicker than the analysis chip. In some cases, the well-forming piece is more than about 5 times thicker, more than about 10 times thicker, more than about 20 times thicker, more than about 50 times thicker, or more than about 100 times thicker than the analysis chip. The well-forming piece can be about 0.5 mm to about 20 mm, about 1 mm to about 10 mm, or about 1 mm to about 4 mm thick. The well-forming top-piece is generally made using a material that has a similar thermal coefficient of expansion as the material of the substrate of the chip. In some cases, the well-forming piece comprises the same material as the substrate of the chip. For example, both the substrate of the chip and the well-forming piece can comprise fused silica.

The diameter of the well can range from, between about 1 mm to about 9 mm, from about 2 mm to about 7 mm, or between about 4 mm and about 6 mm.

In a preferred embodiment, the well-forming piece and the chip are formed on wafers. Such wafers are used in semiconductor and microfabrication processes. The wafer with the well-forming pieces and the wafer with the analysis chips each comprise from 10 to about 1,000,000 or between about 100 and 100,000 analysis chips. The well-forming piece has substantially the same number of well-forming pieces configured to line up with each of the chips. The two wafers are wafer bonded either directly or indirectly. Suitable bonding methods include, fusion bonding, anodic bonding, thermo-compression bonding, or adhesive bonding. After bonding of the wafers, the wafers are diced to yield the plurality of analysis chip assemblies.

We have discovered that where adhesives are used to bond the well forming piece and the chip that in some cases the adhesive can flow into the well region, and in some cases unexpectedly wick in toward the center of the chip, interfering with the optical confinements on the chip. In order to prevent the adhesive from extending from the edges into the active portion of the chip, we have found that we can control such wicking by incorporating features onto the chip that divert the flow of adhesive. In one embodiment, a moat or trench is created in the chip which extends around the perimeter outside of the chip such that adhesive that wicks in from the edges will be trapped in the moat. In one embodiment the invention comprises a chip assembly comprising a well-forming piece on top of a chip in which the well forming piece has an opening which creates a well when the well forming piece is bonded to the chip, and wherein the chip has a depressed region which forms a moat or trench which extends around the outside of the exposed area of the chip such that adhesive which may extend into the exposed area of the chip from the edges of the well where the well-forming piece and the chip are bonded. Where the well-forming piece creates a well with a circular cross-section, the moat will generally be a circular moat which is substantially concentric with the well.

The width, height and distance of the trench from the well wall can be any suitable dimensions for containing and arresting the flow of adhesive. The trench dimensions are generally chosen to provide a trench volume that is large enough to arrest adhesive flow, but not so large that the trench impinges on the active portion of the chip. The width of the trench can be, for example from about 10 micron to about 200 micron, or from about 20 micron to about 100 micron. The depth of the trench can be from about 5 micron to about 50 microns, from about 10 micron to about 20 microns, or about 5 micron to about 10 micron. The aspect ratio of the width to the height of the trench can generally be from about 1:3 to about 3:1 or about 1:2 to about 2:1. The distance between the inner wall of the top piece and the trench can be from about 50 micron to about 500 micron, or about 100 micron to about 300 micron.

Figure 5:
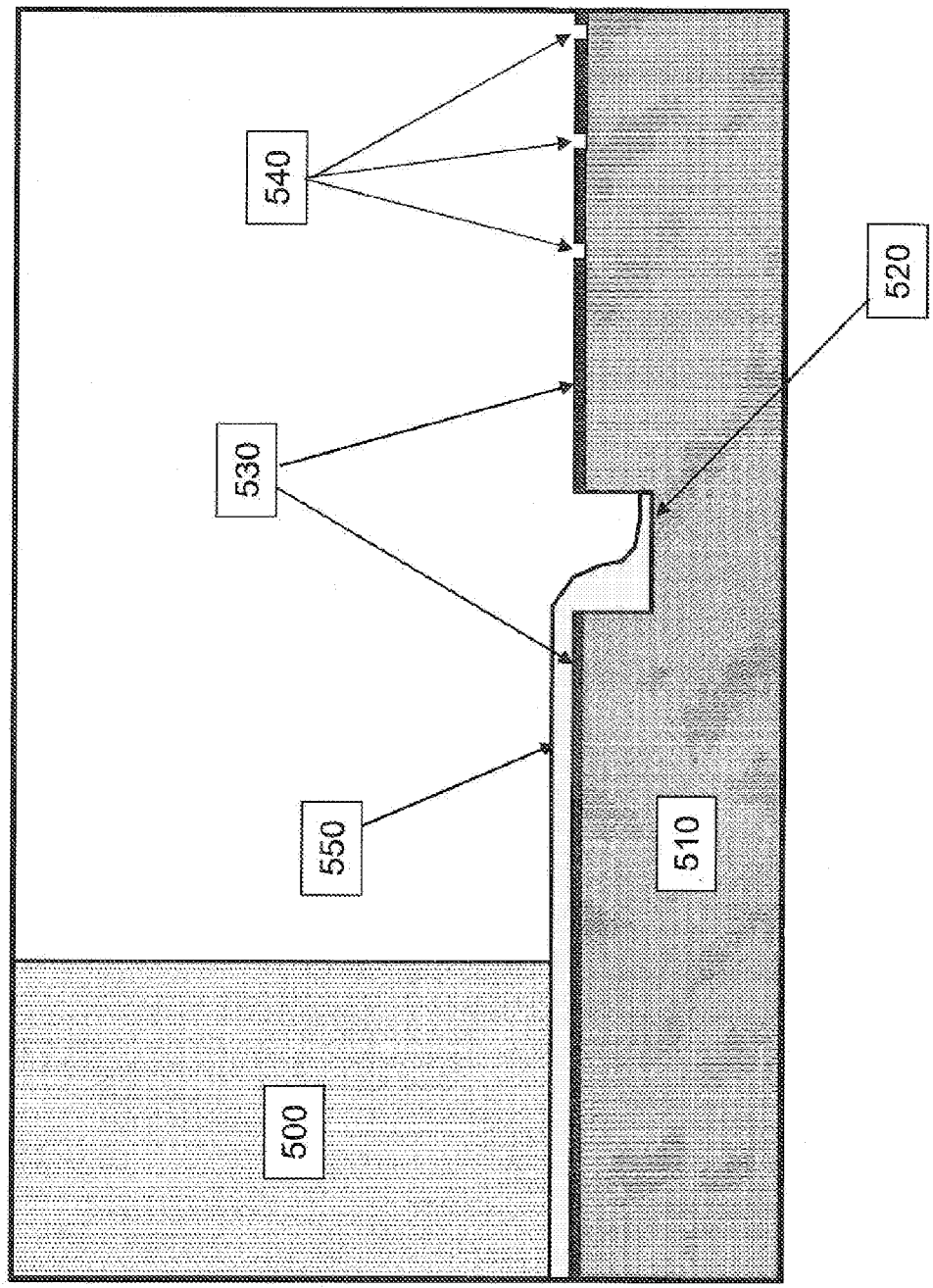
FIG. 5 shows a cross section of a chip assembly wherein the chip comprises a trench to arrest the flow of adhesive.

FIG. 5 shows a cross section of a portion of a chip assembly. Well-forming piece 500 is bonded on top of chip 510. The portion shown in FIG. 5 is the edge of a well formed by having a hole through the well-forming piece in which the exposed portion of the chip comprises the bottom of the well. The well-forming piece and the chip are bonded together using an adhesive 550. The chip has a trench around the outside of the bottom of the well such that if the adhesive wicks into the well, the trench will contain the adhesive and prevent it from extending further across the chip where it could interfere with features on the chip such as optical confinements. For the embodiment shown in FIG. 5 the chip has a plurality of optical confinements 540 which are formed as apertures through a cladding layer 530. The trench 520 prevents the further wicking of the adhesive 550 onto the region of the chip having the optical confinements 540.

The individual chip assemblies can be fabricated using a wafer bonding process. The wafers can be, for example, 6 in or 8 in diameter wafers. The well-forming piece wafer and chip wafer are patterned such that when the wafers are aligned, the holes in the well-forming piece wafer aligns with the regions of optical confinements on the chip wafer. The wafers are bonded by any suitable means of wafer bonding. The wafers can be thermally bonded, laser bonded, fusion bonded, anodically bonded, thermo-compression bonded, or bonded with adhesives including thermally cured, light cured, or UV cured adhesives. Where an adhesive is used, the adhesive is generally applied to the bottom of the well-forming-piece, for example by dipping, spray coating, or micro-drop application. The well-forming piece wafer may have, for example, hundreds to thousands of holes extending through it, each hole forms one well on well-forming of the chip. After bonding, the stacked wafers may undergo a grinding process to thin the chip. Such grinding can be performed, for example, by chemical mechanical polishing (CMP). The bonded wafer can then be diced to produce the individual chip assemblies. The chip assemblies can then be handled by pick and place machines to attach the chip assemblies to the chip carriers. Techniques for carrying out these processes are described, for example in "Introduction to Microfabrication", Fransilla, Ed., Wiley, 2004.

In one embodiment, the thickness of the well-forming piece is between about 1 mm and about 3 mm and the thickness of the chip is between about 500 micron and about 900 microns. After bonding, CMP is used to reduce the thickness of the chip to between about 200 microns and about 600 microns.

Method of Providing a Sealed Analysis Chip

In one aspect, the invention provides a method for providing a sealed analysis chip from a sealed package for further processing and placement into the analysis portion of an analysis instrument. The methods of the invention comprise providing a plurality of analysis chips, each within a sealed chamber sealed with a sealing film. A piercing tool extends through the sealing film, puncturing the film and displacing the film to produce an opening through which the analysis chip can be extracted. Each analysis chip within the sealed chamber is attached to a chip carrier. An extraction tool engages with the chip carrier, detaches the chip carrier from the chamber, and extracts the chip carrier, thus extracting the analysis chip which is bonded to it.

Figure 6:
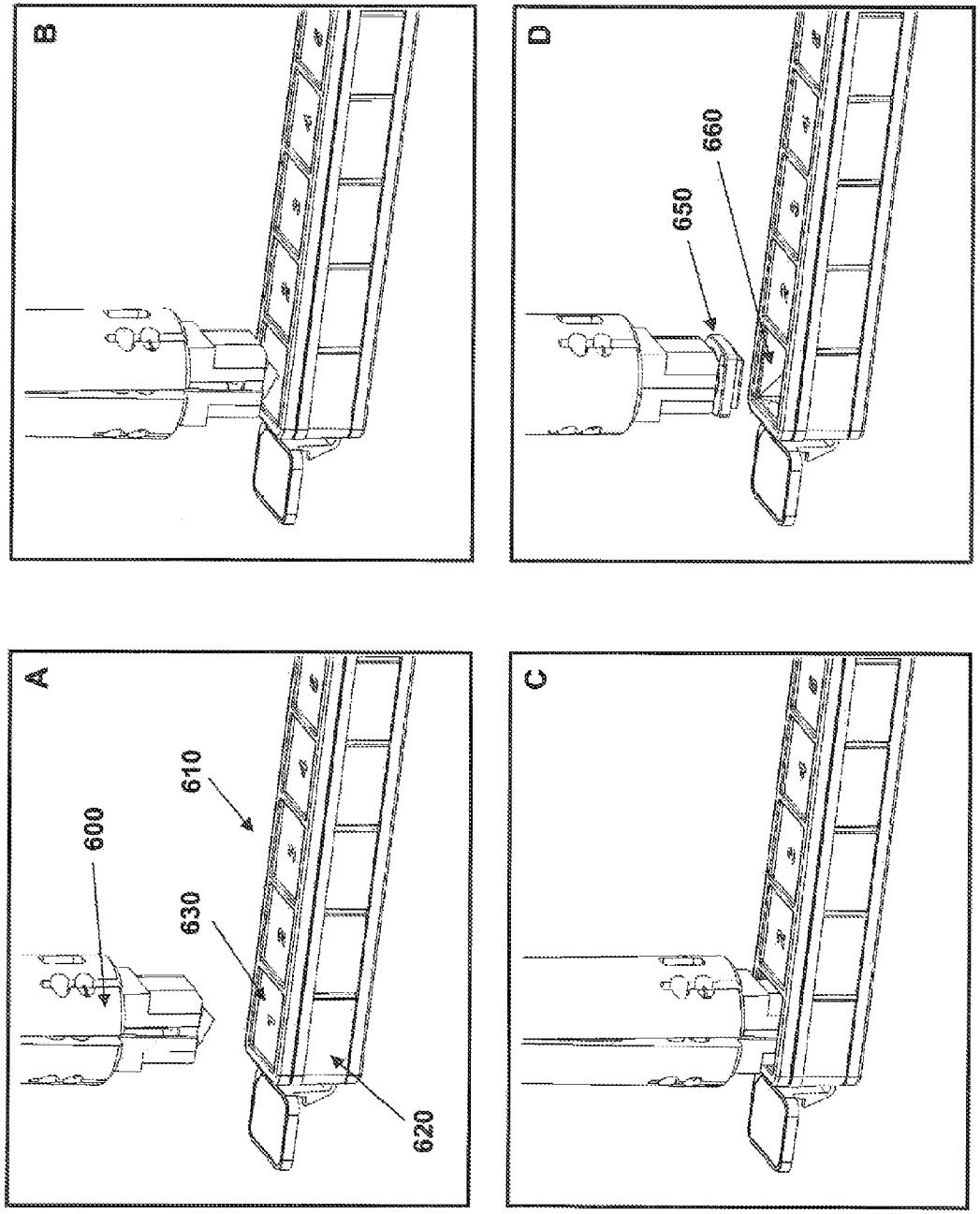
FIGS. 6(A) to 6(D) illustrate a method of the invention for extracting a chip from a sealed strip.

An embodiment of the method is illustrated in FIG. 6. A single piercing extraction tool 600 is used to extract an analysis chip from an environmentally sealed strip 610 by piercing and displacing sealing foil 630 to gain entry into sealed chamber 620. In FIG. 6(B) the piercing/extraction tool is extended from above and down such that the piercing tool portion pierces and cuts the sealing film 630. The piercing tool has four ridges, each of which forms a cut which propagates as the tool extends into the cavity. This creates four flaps, each corresponding to one of the sides of the chamber. The flaps are pushed down and away by the tool such that neither the chip carrier nor the analysis chip will come into contact with the sealing film upon extraction. FIG. 6(C) shows the piercing/extraction tool extended into the chamber. While in the chamber, the piercing tool portion is retracted into the piercing/extraction tool to allow the extraction tool portion to engage with the chip carrier. In the illustrated embodiment, the extraction tool portion closes onto the collar of the chip carrier, gripping the chip carrier. While engaged with the chip carrier, the extraction tool displaces the carrier relative to the strip, detaching the chip carrier from the chamber. Once detached, the chip carrier, bonded to the analysis chip is extracted from the chamber. FIG. 6(D) shows the extraction tool holding the chip carrier 650 that has been extracted from the chamber by lifting the chip carrier up through the opening in the chamber produced by the piercing tool. A flap 660 produced by the action of the piercing tool can be seen in FIG. 6(D).

Figure 7:
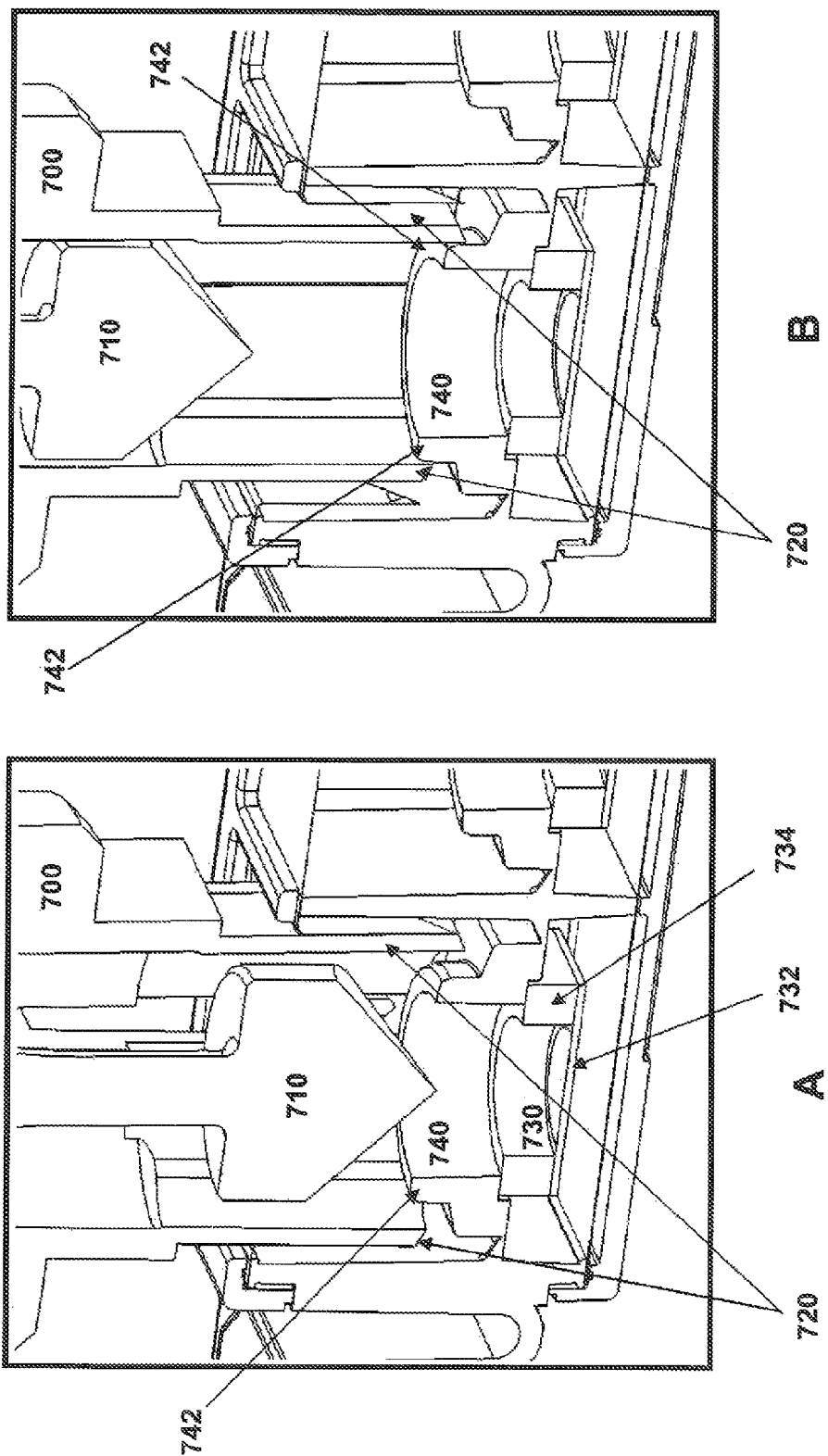
FIGS. 7(A) and 7(B) provide a cross-sectional drawing of a piercing/extraction tool within a chamber of a strip package engaging with a chip carrier comprising an analysis chip.

FIG. 7 shows a cross-sectional view of a single piercing/extraction tool 700 extended into a chamber. In FIG. 7(A) the piercing tool 710 is partially retracted, and the extraction portion of the tool 720 has extended down adjacent to the collar 742 of the chip carrier 740, but has not yet engaged with the chip carrier. The chip carrier is held in place within the chamber by molded tabs. Attached to the chip carrier is the chip assembly 730 comprising the chip 732 bonded to the well-forming piece 734. In FIG. 7(B) the piercing tool 710 has fully retracted, allowing the extraction tool 720 to engage with the collar 742 of the chip carrier 740. Here, the extraction tool comprises fingers which have closed inward to grip the collar 742 of the chip carrier 740.

Figure 8:
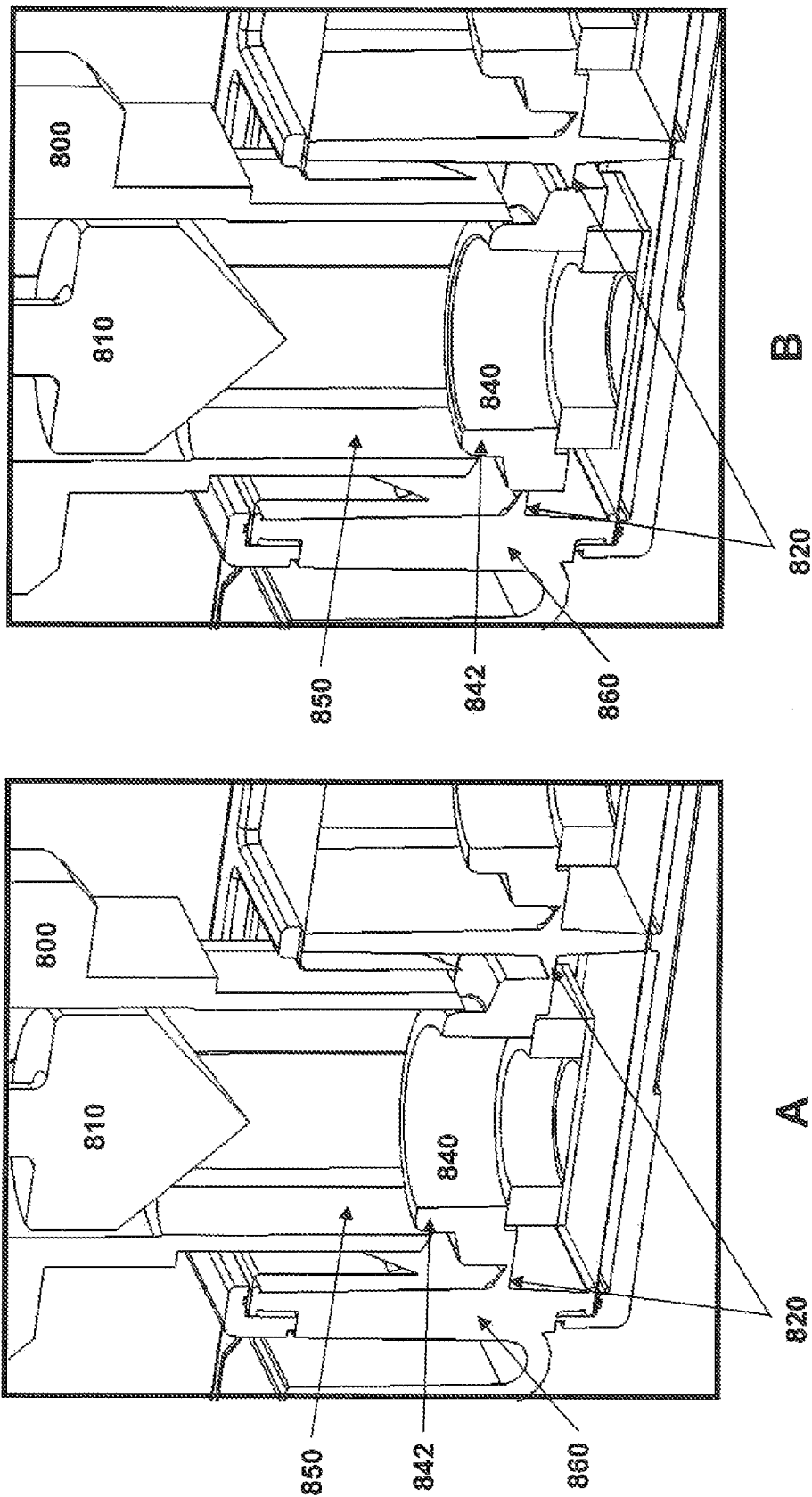
FIGS. 8(A) and 8(B) provide a cross-sectional drawing illustrating an extraction tool displacing a chip carrier within the chamber of a sealed strip to detach the chip carrier.

FIG. 8 has a cross-sectional view illustrating one embodiment of the step of displacing the chip carrier to detach it from the chamber. In FIG. 8(A) the extraction tool 850, which is a part of the extraction/piercing tool 800, has gripped the chip carrier 840 by the collar 842. The piercing tool 810 has been refracted. The chip carrier 840 is held in place with molded tabs 820. In FIG. 8(B) the extraction tool 850 has been moved downward relative to the strip housing 860. The displacement of the chip carrier relative to the strip housing 860 results in the breaking of the molded tabs 820, thereby detaching the chip carrier. The detached chip carrier can then be extracted from the chamber.

Figure 9:
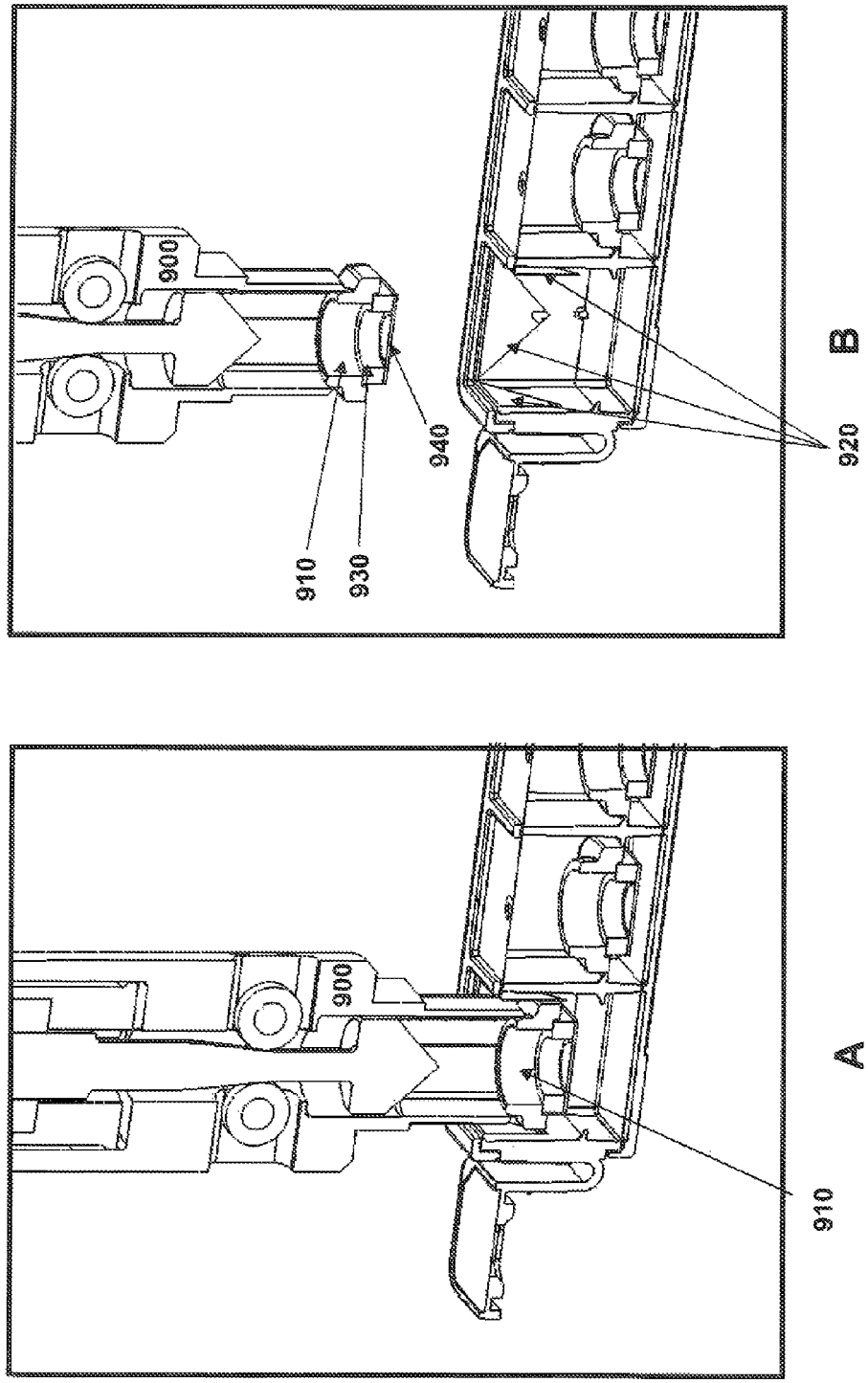
FIGS. 9(A) and 9(B) provide a cross-sectional drawing illustrating the extraction of a chip carrier from the chamber of a sealed strip.

FIG. 9 illustrates the extraction of the detached chip carrier from the chamber. In FIG. 9A, the extraction/piercing tool 900 has been moved upward to lift the chip carrier 910 attached to the analysis chip above the position it was in when it was attached to the chamber. In FIG. 9(B), the extraction/piercing tool 900 has lifted the chip carrier completely out of the chamber. The flaps 920 which were formed upon the piercing, cutting, and displacement of the sealing film have been pushed down and away from the opening of the chamber such that as the chip carrier is removed, there is no contact between the chip carrier and the sealing film. The tool can now move the chip carrier to a processing station where reagents and or sample can be added to the chip assembly, and further processing can be performed.

FIG. 9B also illustrates an embodiment in which the analysis chip 940 and chip assembly 930 are attached to the base of the chip carrier such that the bottom of the chip 940 extends below the bottom of the chip carrier 910. Here, the edges of the chip 940 are exposed below the chip carrier 910 in a manner such that the extraction tool or another tool which engages with the chip carrier can place the chip into a holder which physically references to one or more edges of the chip. Physical alignment to the chip edges provides greater positional accuracy to features on the chip than is generally achieved by physical alignment using the chip carrier.

The method can be used with any suitable environmentally sealed strip including those described herein. The method can be used with a strip having any suitable number of sealed chambers. The number of chambers can be chosen depending on the use, for example for throughput of samples that are to be analyzed. The number of chambers can be, for example, 2, 3, 4, 5, 6, 7, 8, 9, 10, 12, 13, 14, 15, 16 or more. The number of chambers can be between about 2 and about 1000, between about 4 and about 100, or between about 6 and about 24. The chambers are generally arranged side by side in one layer. The method can utilize chambers can be arranged in one or two dimensions. In some cases the chambers are arranged linearly. In other cases, the chambers can be arranged in rows and columns. The chambers can also be arranged radially.

The piercing tool generally has one or more points to pierce the film. In some cases, the piercing tool has one or more ridges which act as blades to cut the sealing film as the piercing tool extends into the chamber. The number of ridges can be 1, 2, 3, 4, 5, 6, 7, 8, 9, 10, 11, 12 or more than 12 ridges. In some cases, the piercing tool has 3 to 8 ridges. In one preferred embodiment, the number of ridges is four, preferably disposed in a cross pattern such that when the tool is extended into the chamber, four flaps are created which can be neatly pushed down and away from the opening. The ridges can be disposed at an angle to the surface of the sealing film such that as the tool is extended into the chamber, a longer and longer cut is made. This approach provides for the controlled cutting of the film along a series of cuts as the tool progresses into the chamber. The blades will generally be at an angle such that the central portion of the sealing film on top of the chambers is contacted first, and the cut propagates from the center toward the edges of the chamber. It is generally desired that if the chambers have a square or rectangular cross-section such that the sealing film is in the shape of a square or cross section, that the cuts extend from the center to the corners of the square or rectangle. Extending to the corners allows for flaps to open a large portion of the area of the chamber.

In addition to cutting the sealing film, the piercing tool of the invention can be dimensioned such that it also displaces the sealing film, for example pushing the film down and away from the opening in the chamber in a controlled manner. This function can be accomplished by having a portion of the tool which has a width that corresponds to the desired dimension for the opening in the sealed film. This portion of the tool can also be a portion of the tool that acts as the extraction tool. For example, the extraction tool in a single piercing/extraction tool can be positioned above and at a position wider than the piercing tool while the tool is extended down into a chamber such that it has a width which displaces the sealing film. The extraction tool can subsequently contract to engage the chip carrier, the closed extraction tool now having smaller outer cross sectional dimensions, such that it does not contact the flaps of sealing film on the way out of the chamber during extraction.

The extraction tool engages with the chip carrier to detach and extract the chip carrier from the chamber. The extraction tool can engage with the chip carrier by any suitable means. Features on the extraction tool and chip carrier can be designed to mate in such a way that the extraction tool can hold the chip carrier. For example, one or more hook, screw, hole, pin, ridge, clip, catch, hanger, nail, clasp, slide, ridge or other feature can be used. It is generally desired that the carrier be reversibly engaged by the extraction tool such that it can be subsequently be placed in various stations for processing, inspection, and analysis. In such cases a tool which is capable of gripping the chip carrier by one or more feature on the chip carrier can be used. For example, the extraction tool can have one or more moveable finger, member, or appendage that can be moved to grasp the chip carrier can be used. For example, the tool can have fingers which close in on the outside of a collar to grasp the chip carrier. Alternately, the tool can have fingers which expand out to hold the tool by pushing against the inside of a collar.

The extraction tool can displace the chip carrier relative to the strip housing in a number of ways. In some embodiments, the chip carrier is displaced down or up. The chip carrier can also be detached by a sideways or a twisting motion. It is generally desired that the displacement distance be relatively small so as not to contact the displaced chip carrier with other portions of the strip housing. In some cases, the displacement is carried out rapidly, for example, in order to snap a break away tab or release an adhesive bond.

The extraction method can further comprise steps of moving the chip carrier to one or more stations for further processing, inspection, and/or analysis. After extraction, the extraction tool generally transports the chip to a processing station or reaction station where the chip carrier is placed. While in the processing station, reagents are added to prepare the chip for analysis. For example, the reagent that is added can include the addition of reagents for immobilizing enzymes onto the chip. The reagents can include sequencing reagents including the reagents required for carrying out a nucleic acid synthesis reaction, for example by a polymerase enzyme. Inspection steps can also be carried out. After the chip carrier has been processed and inspected in one or more process stations, the chip carrier with analysis chip is transported to a station at which analysis is performed. For example the analysis can comprise an optical analysis of multiple regions on the chip simultaneously. The analysis can be the sequencing of nucleic acids on the chip, for example, single molecule DNA sequencing.

In some embodiments, the method is performed with an environmentally sealed strip wherein the analysis chip is bonded to the bottom of the chip carrier, the chip carrier is held toward the bottom of the chamber, and the chip carrier is extracted through the top of the chamber.

In some cases, the method is carried out such that the chip carrier is held within the chamber such that it is below the level at which it would be contacted by the sealing film as it is punctured and displaced by the piercing tool prior to extraction. For example, the chip carrier is held such that the top of the chip carrier is below the sealing film at a distance that is one half of a cross-sectional dimension of the chamber. Where the chamber has a square cross-sectional profile, the top of the chip carrier can be disposed lower than one half of the distance of the length of the side of the square. Where the chamber has a rectangular cross-sectional profile, the top of the chip carrier can be disposed lower than one half of the distance of the length of a side of the rectangle.

Method of Producing a Sealed Analysis Chip

In one aspect, the invention provides a method for producing a sealed chip carrying strip comprising; providing a molded part having a plurality of conduits extending therethrough, each conduit having an open top, and open bottom, and side walls, wherein within each conduit is a chip carrier having a top and a base that is held in the conduit by break-away tabs; attaching a chip assembly comprising an analysis chip to the base of the chip carrier; and sealing the open bottom and the open top to environmentally seal the analysis chips within the conduits; wherein at least one of the open top and open bottom is sealed with a sealing film.

The process of the invention can be described by referring to FIG. 2 which illustrates an embodiment of the process. The strip housing 210 represents a molded part having a plurality of conduits which extend through the housing. Here, each conduit has an open top, an open bottom, and side walls. Within each conduit is a chip carrier having a top and a base that is held in the conduit by break-away tabs. This part can be produced in one molding step. The chip assemblies 220 have an analysis chip on the bottom and a well forming piece bonded to the top of the chip. The chip assemblies 220 are bonded to the bases of the chip carriers in the strip housing. The chip assemblies can be bonded with an adhesive, can be physically clipped or wedged in place, or, can be welded. After the chip assemblies are attached, the chambers are sealed to provide environmental protection. The sealing is generally carried out in a controlled environment. The composition of the controlled environment will depend on the makeup of the chip. The environment will generally have controlled amounts of water and oxygen. In some cases, the amount of water and oxygen will be minimized to control, for example, corrosion and oxidation. In some cases, a controlled amount of moisture is desirable. For example, in some cases, enzymes, nucleotides, proteins or other biomolecules can be included on the chip that is sealed within the chamber where the presence of water is beneficial for the stability of the biomolecules. In some cases, the sealing is carried out in an environment comprising predominantly nitrogen or argon inert gasses having low levels of oxygen.

The sealing film 240 is used to seal the top openings of the conduits. The sealing can be accomplished using heat sealing. The sealing can be accomplished using adhesives such as pressure sensitive, hot melt, or light cured adhesives. The bottom openings of the conduits are also sealed by the same or in a different manner than the sealing of the top openings. As shown here, a sealing film 250 is used to seal the bottom openings. In other embodiments the bottom openings are sealed with rigid piece, for example, piece that is more rigid than the sealing film. Where, as shown in FIG. 2, a sealing film is used to seal the bottom openings, a base piece 250 can be attached to the bottom of the strip housing to provide a more durable strip package. The base piece can be attached by any suitable means including adhesion. In some cases, the base piece is snapped onto the strip housing. In some embodiments, no sealing film is used to seal the bottom of the chambers, and a rigid base piece is attached, for example by laser welding or with adhesives such that an environmental seal of the chambers is formed.

Instrument

In one aspect the invention provides an analysis instrument for extracting a sealed analysis chip, subjecting the chip to pre-analysis processing, and then performing an analysis using the chip. The instrument has a station for receiving a sealed environmental strip having sealed chambers. The chambers on the strip are sealed with a sealing film. Inside each chamber in the strip is a chip carrier which is bound to an analysis chip. The instrument is an automated instrument under computer control. The instrument has an automated chip extractor that has a piercing tool and an extraction tool. The piercing tool is configured to pierce the sealing layer a chamber; and generally to open a hole through which the chip carrier holding the chip can be extracted. The extraction tool is configured to engage with the chip carrier, and to remove the chip carrier from the strip. The extraction tool also transports the analysis chip to one or more other stations within the instrument. Such stations include processing stations, inspection stations, and analysis stations.

The processing stations carry out processes for preparing the chip for analysis and for introducing the sample to the chip. The processing stations can carry out reaction processes such as the addition and removal of reagents, heating and cooling, filtration, centrifugation, purification, and agitation. The automated processing station can carry out many of the chemical, biochemical, and molecular biological processes that can be carried out manually in the laboratory. Automated sample processing stations are known in the art. Such processing instrumentation can be custom made. Systems and components are commercially available, for example from the companies Caliper Corporation, Zymark, ThermoFisher, and Tecan.

The analysis system can carry out any suitable type of analysis using the chip. The instruments of the present invention are particularly suited for highly multiplexed analyses in which a liquid sample is in contact with the chip during the analysis. The instruments are suited for optical analysis on a chip having multiple analysis regions on its surface. The analysis can be the a hybridization analysis for detecting binding of specific nucleic acids, for example for determining genetic or gene expression information such as described in U.S. Pat. Nos. 5,837,832 and 6,841,663. The analysis can comprise the observation of single molecules such as described in U.S. Pat. No. 7,292,742. The analytical instrument can be used for nucleic acid sequencing, for example as descried in U.S. Pat. Nos. 7,335,762 and 7,232,656.

The piercing tool and extraction tool of the instrument can be any suitable piercing or extraction tool including the piercing and extraction tools described herein.

The sample strip accepted by the instrument has a plurality of chambers. The number of chambers can be chosen depending on the use, for example for throughput of samples that are to be analyzed. The number of chambers can be 2, 3, 4, 5, 6, 7, 8, 9, 10, 12, 13, 14, 15, 16 or more. The number of chambers can be between about 2 and about 1000, between about 4 and about 100, or between about 6 and about 24. The chambers are generally arranged side by side in one layer. The chambers can be arranged in one or two dimensions. In some cases the chambers are arranged linearly. In other cases, the chambers can be arranged in rows and columns. The sealed strip can be dimensioned for manual handling by operators, as well as by automated robotic systems.

One aspect of the invention is an instrument configured to carry out the methods described herein. In one embodiment, the instrument is configured to method of providing an analysis chip comprising: providing a strip having a plurality of sealed chambers, each chamber having a bottom, a top, and sidewalls, the top of each chamber sealed with a sealing film; wherein a chip carrier comprising an analysis chip is disposed within each chamber; piercing the sealing layer of at least one of the chambers with a piercing tool; and extracting the chip carrier from the chamber with an extraction tool.

In some cases, the chip carrier comprising the analysis chip is extracted, moved to at least one processing station where the analysis chip is processed, and then the chip is moved to an analysis station where the chip is analyzed. In some embodiments, the analysis chip is bonded to the base of the chip carrier such that the analysis chip extends below the bottom of the chip carrier. The exposed portion of the chip can be used to physically align the chip within the analysis station. For example, one or more edges of the chip can be used to physically align the analysis chip in the analysis station in order to orient the chip with the analysis equipment. This can be particularly useful for optical systems for analyzing large numbers of samples on the chip.

We claim:

1. An analysis instrument comprising:
a) a station for receiving a sealed environmental strip having a plurality of individually sealed chambers, each chamber having a bottom, a top, and sidewalls, the top of each chamber sealed with a sealing film; wherein a single chip carrier comprising an analysis chip is disposed within each chamber;
b) an automated chip extractor comprising (i) a piercing tool that pierces the sealing layer of at least one of the chambers; and (ii) an extraction tool that extracts the chip carrier from the chamber and transports the chip carrier comprising the analysis chip to an automated processing station;
c) an automated processing station that prepares the chips for analysis by adding at least one reagent, and at least one sample to the chip;
d) a tool for transporting the chip carrier comprising the analysis chip from the processing station to an analysis station; and
e) an analysis station which holds the chip carrier comprising the analysis chip in place during analysis.

2. The analysis instrument of claim 1 comprising a nucleic acid sequencing station.

3. The analysis instrument of claim 1 wherein the piercing tool comprises one or more ridges, each ridge configured to make a cut in the sealing film.

4. The analysis instrument of claim 1 wherein the tool has four ridges.

5. The analysis instrument of claim 1 wherein the piercing tool extends through the sealing film and pushes down the film to create an opening through which the chip carrier is extracted.

6. The analysis instrument of claim 1 wherein the piercing tool has four cutting ridges such that when the piercing tool extends through the film, four cuts are made to produce four flaps which are pushed down into the chamber by the piercing tool.

7. The analysis instrument of claim 1 wherein the top of each chamber is sealed with a sealing film, and the chip carriers are disposed in the bottom portion of each chamber.

8. The analysis instrument of claim 1 wherein the piercing tool and the extraction tool are incorporated into a single piercing/extraction tool.

9. The analysis instrument of claim 1 wherein the piercing portion of the piercing tool is retractable.

10. The analysis instrument of claim 1 wherein the chip carrier is attached to the chip through break-away tabs.

11. The analysis instrument of claim 10 wherein the break-away tabs are molded tabs.

12. The analysis instrument of claim 1 wherein the strip is a linear strip having from 2 to 12 chambers.

13. The analysis instrument of claim 1 herein the sealing film comprises a foil, a polymer, or a combination thereof.

14. The analysis instrument of claim 1 wherein the analysis chip is bonded to the chip carrier whereby the analysis chip extends below the chip carrier.

* * * * *